United States Patent [19]

Nomura et al.

[11] Patent Number: 4,532,422
[45] Date of Patent: Jul. 30, 1985

[54] ELECTRON HOLOGRAPHY MICROSCOPE

[75] Inventors: Setsuo Nomura, Nishitama; Akira Tonomura, Koganei; Nobuo Hamamoto, Nishitama; Akira Fukuhara, Hachioji, all of Japan

[73] Assignee: Hitachi, Ltd., Tokyo, Japan

[21] Appl. No.: 472,232

[22] Filed: Mar. 4, 1983

[30] Foreign Application Priority Data

Mar. 12, 1982 [JP] Japan .................................. 57-38013

[51] Int. Cl.³ ...................... G01N 23/00; H01J 39/12
[52] U.S. Cl. ................................ 250/306; 250/237 G; 358/93
[58] Field of Search ........... 250/306, 310, 311, 237 G; 358/90, 2, 93

[56] References Cited

U.S. PATENT DOCUMENTS

| 3,591,715 | 7/1971 | Rubin et al. | 358/93 |
| 3,835,246 | 9/1974 | Muller et al. | 258/93 |
| 3,889,056 | 6/1975 | Mayer et al. | 358/93 |
| 4,025,898 | 5/1977 | Shaw | 250/237 G |
| 4,102,577 | 7/1978 | Suzuki et al. | 250/237 G |

FOREIGN PATENT DOCUMENTS

| 52-58980 | 5/1977 | Japan | 358/93 |
| 53-136425 | 11/1978 | Japan | 358/93 |

Primary Examiner—Alfred E. Smith
Assistant Examiner—Richard Hanig
Attorney, Agent, or Firm—Antonelli, Terry & Wands

[57] ABSTRACT

The present invention provides an electron holography microscope producing an interference pattern having contour moire lines which is displayed on a cathode-ray tube. With the invention the three-dimensional structure of a specimen can be readily observed on the cathode-ray tube. The electron holography microscope of the present invention comprises a television camera which picks up the interference pattern a straight line fringe output means for delivering a straight line fringe pattern the direction and interval of which are selected at will. Outputs of the television camera and the means are added in a multiplier and the result is displayed on the cathode-ray tube.

10 Claims, 5 Drawing Figures

ELECTRON HOLOGRAPHY MICROSCOPE

BACKGROUND OF THE INVENTION

The present invention relates to an electron holography microscope which displays the three-dimensional structure, magnetic domain structure, etc. of a specimen in accordance with an electron holography method.

Recently, holography has been used in the field of electron microscopy similarly to the use of light, owing to the fact that a high-brightness electron gun in the form of a field-emission electron gun has been put into practical use. Electron beam holography is such that, as shown in FIG. 1, an electron beam 2' emanating from a high-brightness electron gun 2 in an electron microscope housing 1 is divided by an electron beam prism 4 into a specimen electron beam transmitted through a specimen 3 which contains information of the specimen, and a reference electron beam passing outside the specimen which functions as a reference of the electron beam phase. The two electron beams interfere on the focusing plane of the electron microscope so as to form an electron beam interference pattern 5. As a result, a fringe pattern, as illustrated in FIG. 2, appears on the focusing plane of the electron microscope, in superposition on a fine specimen image 6 which has been produced in prior holography microscopes. Whereas the conventional electron microscope specimen image 6 is a two-dimensional shadow image of the specimen, the fringe pattern gives three-dimensional information which is a function of electron beam shift in the specimen. More specifically, the interference pattern 7 of the part outside the specimen is a fringe pattern of straight lines having a period of $M \lambda/\sin \alpha$ wherein M is the magnification of the electron microscope, $\lambda$ is the wavelength of the electron beam and $\alpha$ is the tilting angle of the electron beam as shown in FIG. 2. In contrast, the interference pattern 6 of the part transmitted through the specimen 3 deviates from the straight lines. The deviation is attributed to the fact that the electron beam has its phase disordered when transmitted through the specimen. The quantity $\rho$ of the deviation is proportional to the thickness of the specimen in the corresponding part. Accordingly, when the parts in the interference pattern in which the quantities of deviation are a fixed value are traced, a contour line map concerning the thickness of the specimen is obtained, and a three-dimensional structure is produced.

In prior-art electron holography microscopes, very complicated operations were performed to obtain the contour line map for the reason that the interference pattern is formed by the electron beam in the vacuum microscope housing. More specifically, the electron beam interference pattern is recorded on a photographic film in the vacuum camera chamber of the electron microscope, and the photographic film is taken out of the electron microscope. The photographic film is developed, fixed and dried in a darkroom, to obtain a hologram film which can be optically processed. Next, the film is set on a holographic picture reconstructing apparatus which employs a laser source, an optical lens-system and an optical prism. The conditions of interference of the laser beam are adjusted to obtain a reconstructed hologram image which expresses the contour line map. Thus, the aforementioned series of operations in the prior art electron holography microscope have required a period of time of nearly one day or more and involved complicated operations such as the darkroom processes and adjustments of the holographic picture reconstructing apparatus. The time necessary to obtain a holographic picture in the prior art system has been especially disadvantageous where the immediate investigation of a three-dimensional structural variation of the specimen is required.

SUMMARY OF THE INVENTION

It is accordingly an object of the present invention to provide an electron holography microscope which immediately offers a contour line map of a specimen without resorting to a photographic film or an optical holographic picture reconstructing technique.

In order to accomplish this objective, in the electron holography microscope of the present invention, first, an electron beam interference pattern is formed on a fluorescent screen and is picked up by a television camera. Next, moire fringes of long period, which arise when two fine fringe patterns are superposed, are utilized for tracing places where the quantities of deviation of interference fringes are a fixed value. When fine fringes extending in quite the same direction as that of interference fringes arising outside a specimen are prepared and superposed on interference fringes obtained from the specimen, places of a fixed deviation value appear as points of intersection between the two fringe patterns which intersection points are observed by the human eye as a moire fringe indicating a contour line map. The aforementioned fine fringes (hereinbelow, termed the "basic fringes") are used as a scale for normalizing the quantities of deviation. When the situation in which the moire fringes indicative of the contour line map are depicted as in FIG. 3, conditions required for the basic fringes are understood. The conditions are that the direction of the basic fringes is quite identical to the direction of the interference fringes of the part outside the specimen, and that the period of the former is equal to, or $1/n$ (n;integer) of, the period of the latter. In FIG. 3, solid lines depict the interference fringes while dotted lines depict the basic fringes. As a result, the points of intersection between the two fine fringes, namely, parts indicated by marks A, B and C, in the figure respectively, are visually recognized as lines (moire fringes).

The interference pattern is picked up by the television camera in which it is converted into an electric signal. Then, the electrical superposition of the pattern of the basic fringes on the resulting picture is produced by operating a signal multiplier and a switching circuit in synchronism with the scanning of picture elements. The basic fringe pattern can be electrically formed by the use of, for example, a sinusoidal wave generator circuit. Further, the interference fringes of the part outside the specimen have a fringe pattern which is quite the same in both the direction and period as that of interference fringes arising in the absence of the specimen. Therefore, the interference fringes may be picked up by the television camera without the specimen and stored in an image storage device to permit later use of the fringes in conjunction with the holographic image produced by a scanner of the interference pattern produced by the holographic microscope.

DETAILED DESCRIPTION OF THE PREFERRED EMBODIMENTS

Preferred embodiments of the present invention are described with reference to FIGS. 4 and 5.

Figure 1:
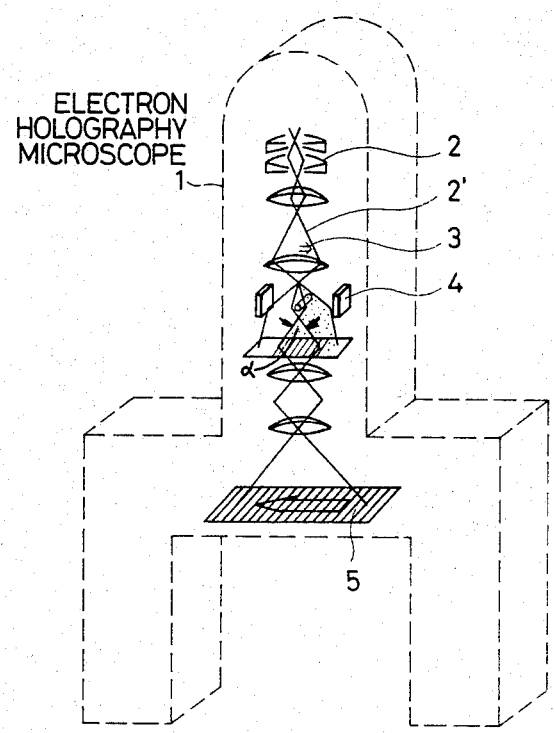
FIG. 1 is a constructional view of a prior-art electron holography microscope.
Figure 2:
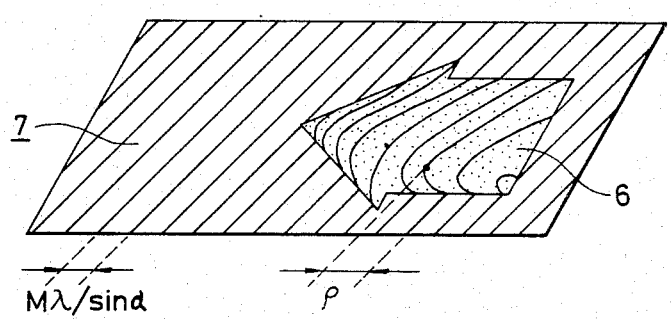
FIG. 2 illustrates an electron beam interference pattern viewed obliquely from above.
Figure 3:
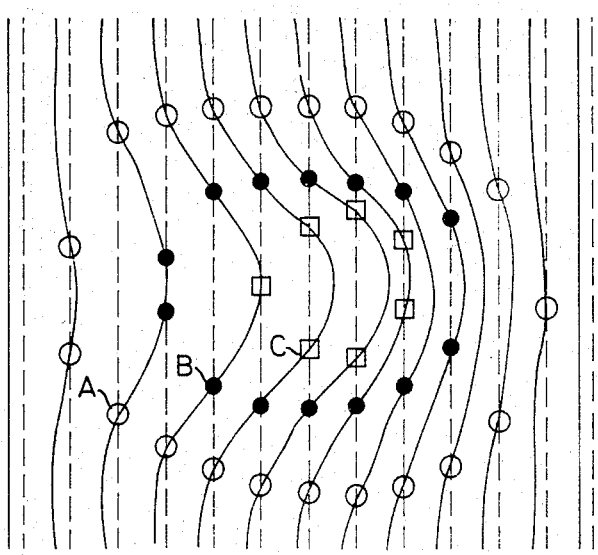
FIG. 3 illustrates an interference pattern with contour lines depicted in accordance with the present invention.
Figure 4:
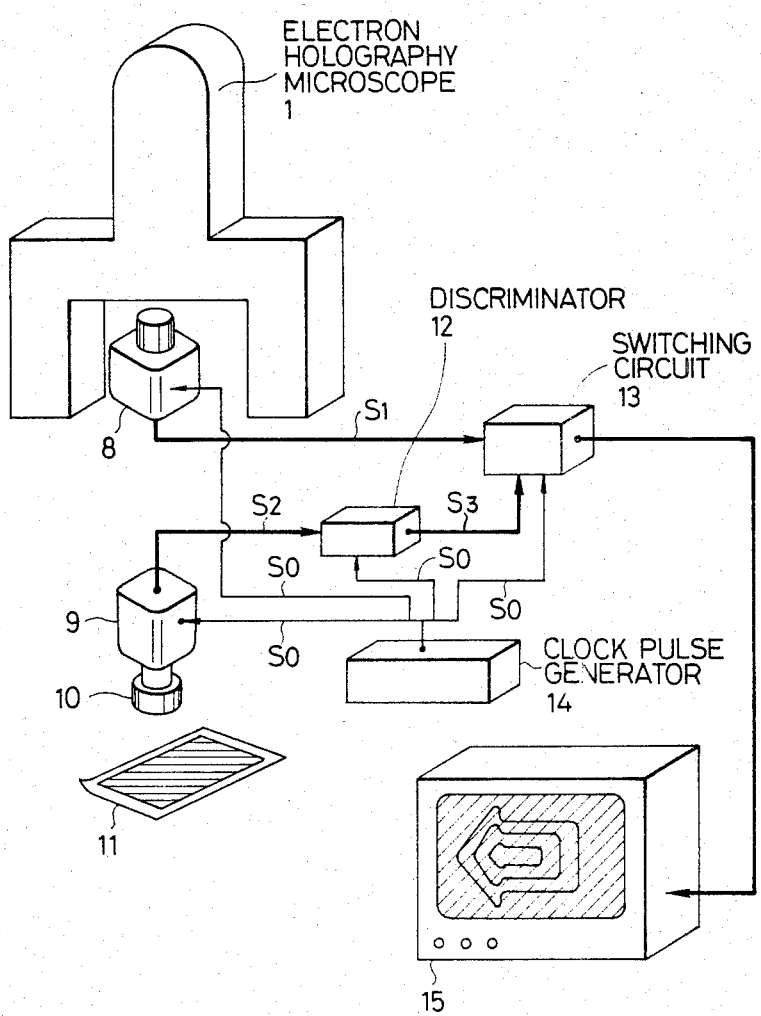
FIG. 4 is a constructional view of an embodiment of an electron holography microscope according to the present invention.

FIG. 4 illustrates an embodiment of the present invention where a basic fringe pattern is generated by basic fringes depicted on chart paper 11 scanned by a second television camera 9. The output signal $S_2$ of the television camera 9 is compared with a certain threshold value by a discriminator 12. When the signal $S_2$ is larger than the threshold value, the discriminator provides the binary signal $S_3$ of "1", and when smaller than the threshold it provides the binary signal $S_3$ of "0". An interference pattern $S_1$ is picked up by a first television camera 8 through a window in the housing 1 of the electron microscope. The binary-coded signal $S_3$ picked up by the television camera 9 and the signal $S_1$ from television camera 8 synchronously enter a switching circuit 13. The television cameras 8, 9, the discriminator 12 and the switching circuit 13 are synchronized with a clock pulse signal $S_0$ produced by clock pulse generator 14. When $S_3 = 1$, the switching circuit 13 passes the interference pattern signal $S_1$ to a monitor 15. When $S_3 = 0$, when the dark part of the basic fringes are smaller than the threshold value, the corresponding interference pattern signal $S_1$ is modulated to zero, which is displayed on the monitor 15 as a dark area. The period of the basic fringes can be selected at will by a zoom lens 10, which is mounted on the television camera 9, being adjusted to vary the image magnification. The direction of the basic fringes can be adjusted by rotating either the television camera 9 or the chart paper 11.

Figure 5:
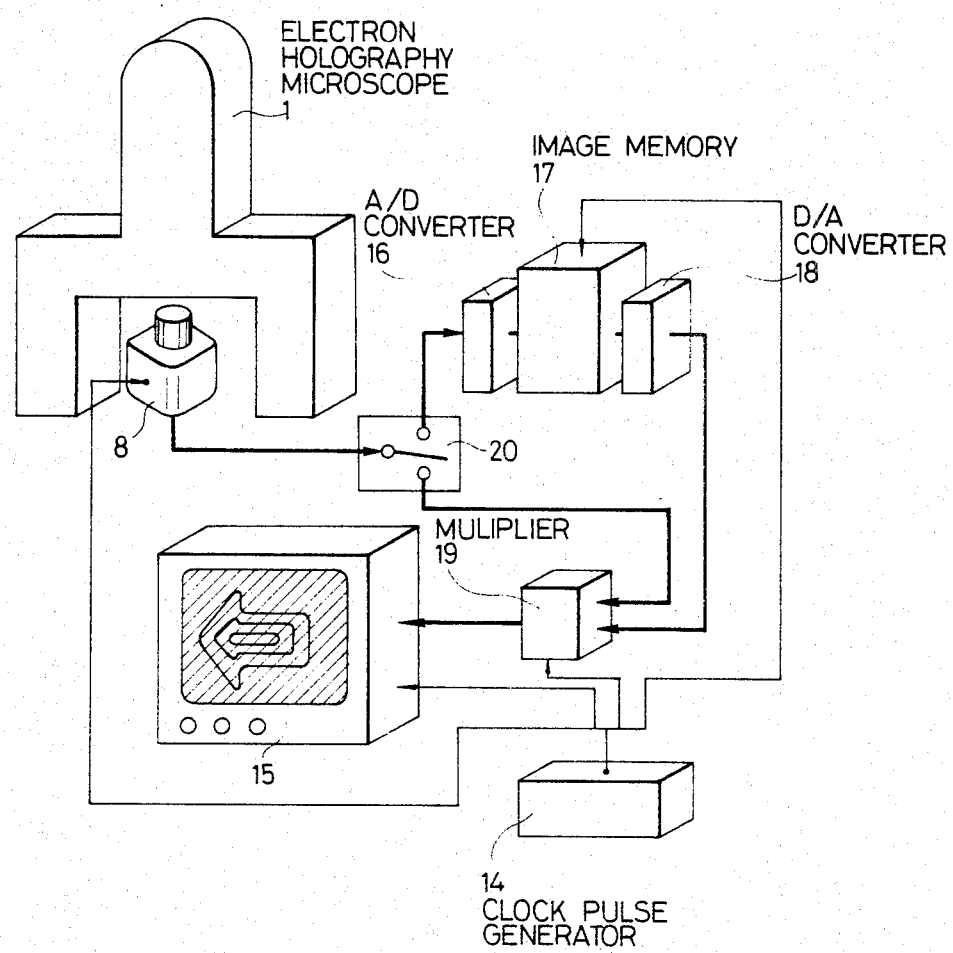
FIG. 5 is a constructional view of another embodiment.

FIG. 5 shows another embodiment of the present invention, which utilizes interference fringes in the absence of a specimen to generate a basic fringe pattern. First, a signal change-over switch 20 is positioned such that the contact is connected to the A/D converter 16. A specimen is moved from a predetermined position which prevents it from falling within the field of view of a hologram image, into the field of view of the television camera 8 so that the hologram image is picked up by a television camera 8 and stored in an image memory 17. The present embodiment uses a frame memory which converts each picture element signal into an 8-bit digital signal and stores the latter in the frame memory. Next, the operator returns the specimen to the predetermined position, sets the signal change-over switch 20 to connect the contact to the signal multiplier 19 and observes the image of the specimen. The television monitor displays an image, which is produced by the addition of the image stored in the memory 17, which is converted into analog by D/A converter 18, and the image produced by television camera 8 within multiplier 19. The present embodiment uses the identical television camera 8 for the imaging of the basic fringes and the imaging of the specimen image. Therefore, even when image distortion is present in the television camera, the optical system of the electron microscope, etc., the distortions are compensated at the formation of moire fringes.

With the invention the basic fringes and the interference fringes of the part outside the specimen are in quite the same direction in principle, so that no problem occurs even when the direction of the fringes has changed at the time of, e.g., the change of the magnification of the electron microscope. Further, unlike the contour line map in the prior-art electron holography method, the contour line map in the electron holography microscope of the present invention manifests the fine fringe pattern of the basic fringes in addition to the contour pattern. Since, however, the fine fringe pattern utterly differs in the spacial frequency from the moire fringes indicative of the contour lines, it can be removed by an image processing technique employing a computer.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

What is claimed is:

1. An electron holography microscope system comprising:
   (a) an electron holography microscope for producing an interference pattern of a specimen;
   (b) image forming means for producing an electrical output signal produced by the scanning of the interference pattern of the specimen formed by the electron holography microscope;
   (c) means for generating a signal representing a straight line fringe pattern as a basic fringe pattern produced by scanning an image of spaced apart parallel lines as basic fringes, the spacing between the interference fringes of the interference pattern and the spaced apart parallel lines being such that the ratio of the spacing between adjacent parallel spaced apart lines and the spacing between adjacent interference fringes is 1 or 1/n, where n is an integer;
   (d) means for combining the straight line fringe signal and the electrical output signal of the image forming means to produce a composite signal; and
   (e) means for displaying the composite signal to produce a composite image of the interference pattern of the specimen and the straight line fringe signal.

2. An electron holography microscope system in accordance with claim 1, wherein the means for generating a straight line fringe signal comprises:
   (a) a television camera with variable magnification optics which is imaged on a series of parallel spaced apart lines; and
   (b) means for rotating the orientation of the parallel spaced apart lines with respect to a field of view of the camera.

3. An electron holography microscope system in accordance with claim 1, wherein the means for generating a straight line fringe signal comprises:
   (a) means for producing an electrical output signal of an electron beam interference pattern produced by the electron holography microscope without the specimen being in the field of view;
   (b) means for storing the electrical output signal of the means which produces the electrical output signal of the electron beam interference pattern produced by the electron holography microscope without the specimen being in the field of view; and (c) means for reproducing the stored electrical output signal synchronously with the scanning of the specimen by the image forming means.

4. An electron holography microscope system in accordance with claim 3, wherein
(a) the image forming means and the means for producing an electrical output signal comprises a single television camera; and
(b) the means for displaying comprises a television monitor.

5. An electron holographic microscope system in accordance with claim 2, wherein
(a) the image forming means is a television camera; and
(b) the means for displaying comprises a television monitor.

6. An electron holography microscope comprising:
means for irradiating an electron beam into a specimen;
means for dividing the electron beam into a specimen electron beam transmitted through the specimen which contains information of the specimen and a reference electron beam passing outside the specimen which functions as a reference of electron beam phase;
means for producing an interference pattern of the specimen electron beam and the reference electron beam on a focusing plane of the microscope;
an image forming means for producing an electrical output signal produced by scanning the interference pattern formed by the electron holography microscope means;
means for generating a straight line fringe signal produced by scanning an image of spaced apart parallel lines as basic fringes, the direction of the basic fringes being identical to the direction of the interference fringes which appear on the focusing plane corresponding to the part outside the specimen, and the period of the basic fringes is equal to, or 1/n of, the period of the interference fringes which appear on the focusing plane corresponding to the part outside the specimen, where n is an integer;
means for compositing the straight line fringe signal and the electrical output signal of the specimen to produce a composite signal; and
means for displaying the composite signal to produce a composite image of the interference pattern of the specimen and the straight line fringe signal.

7. An electron holography microscope in accordance with claim 6, wherein the means for generating a straight line fringe signal comprises:
a television camera with variable magnification optics which is imaged on a series of parallel spaced apart lines; and
means for rotating the orientation of the parallel spaced apart lines with respect to a field of view of the camera.

8. An electron holograph microscope in accordance with claim 6, wherein the means for generating a straight line fringe signal comprises:
means for producing an electrical output signal of an elecron beam interference pattern produced by the electron holography microscope means without the specimen being in the field of view;
means for storing the electrical output signal of the means which produces the electrical output signal of the electron beam interference pattern produced by the electron holography microscope means without the specimen being in the field of view; and
means for reproducing the stored electrical output signal synchronously with the scanning of the specimen by the image forming means.

9. An electron holography microscope in accordance with claim 8, wherein
the image forming means, and the means for producing an electrical output signal comprises a single television camera; and
the means for displaying comprises a television monitor.

10. An electron holographic microscope in accordance with claim 7, wherein
the image forming means is a television camera; and
the means for displaying comprises a television monitor.

* * * * *